(12) United States Patent
Oyoshi

(10) Patent No.: US 8,829,361 B2
(45) Date of Patent: Sep. 9, 2014

(54) WIRING BOARD AND MOUNTING STRUCTURE USING THE SAME

(71) Applicant: KYOCERA SLC Technologies Corporation, Yasu (JP)

(72) Inventor: Takafumi Oyoshi, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/060,475

(22) Filed: Oct. 22, 2013

(65) Prior Publication Data

US 2014/0116762 A1 May 1, 2014

(30) Foreign Application Priority Data

Oct. 31, 2012 (JP) ................................ 2012-240756

(51) Int. Cl.
*H05K 1/11* (2006.01)

(52) U.S. Cl.
USPC .......................................... 174/262; 174/260

(58) Field of Classification Search
USPC .................. 174/260, 262–266; 361/767–779
See application file for complete search history.

(56) References Cited

U.S. PATENT DOCUMENTS 7,294,790 B2 * 11/2007 Van Horn et al. ............. 174/260
7,589,283 B2 * 9/2009 Danoski et al. ............... 174/260

FOREIGN PATENT DOCUMENTS

JP 2010-278414 A 12/2010

* cited by examiner

*Primary Examiner* — Jeremy C Norris
(74) *Attorney, Agent, or Firm* — Procopio, Cory, Hargreaves & Savitch, LLP

(57) ABSTRACT

A wiring board includes a rectangular mount region surrounded by four sides circumscribed to pads located in an outer peripheral area among a plurality of pads arranged in a substantially matrix form, a corner pad close to a corner of the mount region, and a second via-conductor and a second corner via-conductor electrically connected to the corner pad via a first via-conductor and a first wiring conductor. In the wiring board, a distance in a plane direction between the second corner via-conductor and a center of the mount region is smaller than a distance in the plane direction between the corner pad and the center of the mount region.

7 Claims, 2 Drawing Sheets

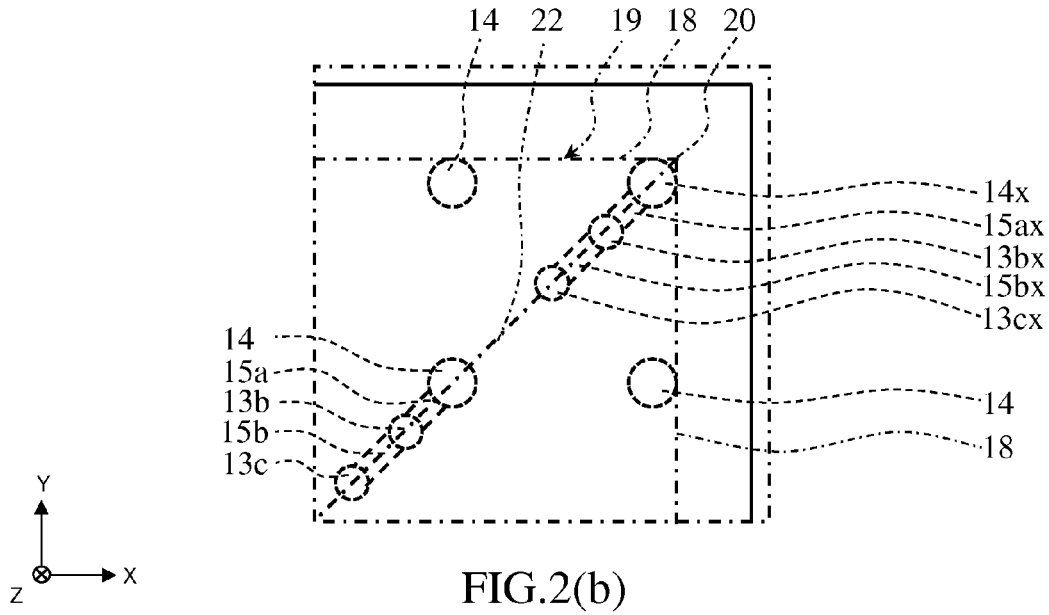
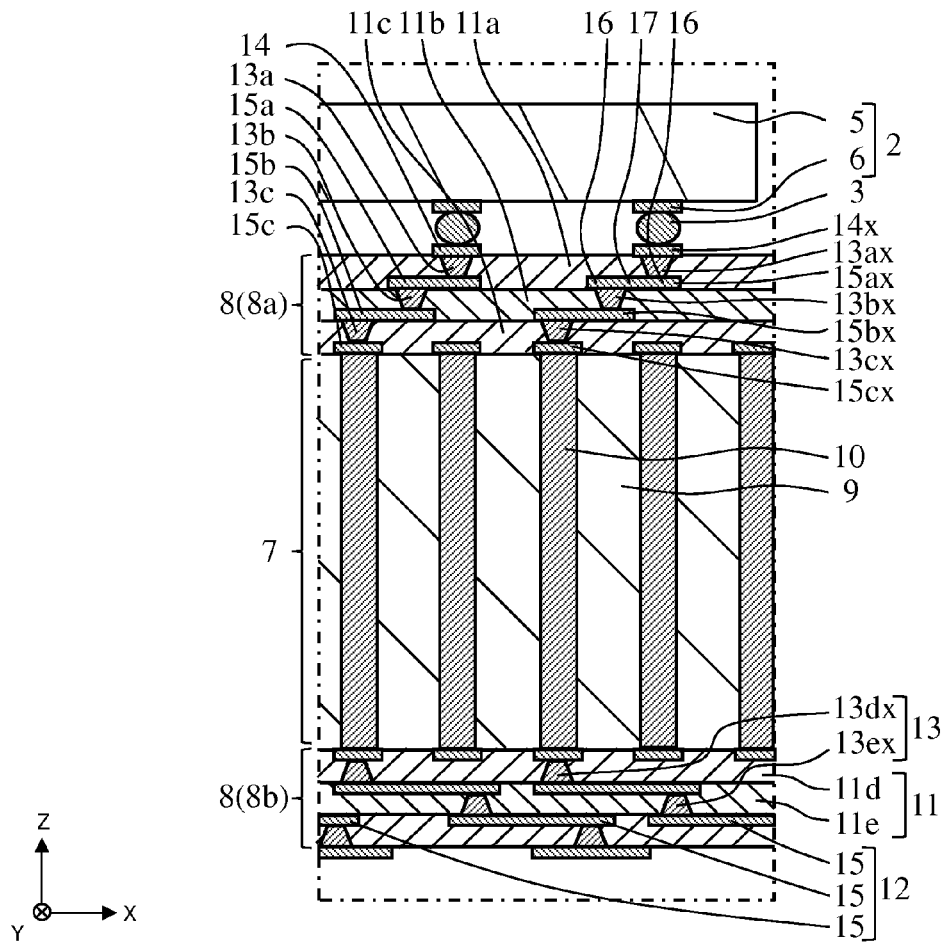

WIRING BOARD AND MOUNTING STRUCTURE USING THE SAME

BACKGROUND OF THE INVENTION (1) Field of the Invention

The present invention relates to a wiring board used for various electronic devices (for example, audio visual devices, electrical household appliances and electrical equipment, communication devices, computer devices, and peripherals thereof) and the like, and to a mounting structure using the wiring board.

(2) Description of the Related Art

Conventionally, a mounting structure in which an electronic part is mounted on a wiring board is used for electronic devices. For example, Japanese Unexamined Patent Publication No. 2010-278414 discloses a wiring board in which a plurality of resin insulating layers (resin layers) and a plurality of conductor layers are alternately laminated and via-conductors, to which the plurality of conductor layers are electrically connected, are provided in the resin insulating layers. The plurality of conductor layers include conductor layers (wiring conductors) disposed between the plurality of resin insulating layers, and a plurality of terminal pads (pads) which are arranged in an array form (matrix form) on an uppermost resin insulating layer.

However, in such a conventional wiring board, the via-conductors and wiring conductors peel off and thus electrical disconnection easily occurs. This is likely to result in deterioration in electric reliability of the wiring board.

Therefore, the wiring board which is excellent in electric reliability is demanded.

SUMMARY OF THE INVENTION

The present invention provides a wiring board which is excellent in electric reliability and a mounting structure using the wiring board.

As for the conventional wiring board, the inventor has found that the easy peeling off of the via-conductors and wiring conductors is attributable to application of thermal stress to the via-conductors and wiring conductors. That is, when an electronic part is connected to pads of the wiring board, if heat is applied to the wiring board and electronic part, thermal stress which is attributable to difference in coefficient of thermal expansion between the wiring board and electronic part is applied to connections between the via-conductors and wiring conductors via the pads of the wiring board. This thermal stress easily concentrates on the connection between the via-conductor and the wiring conductor which is electrically connected to a pad located in a corner among a plurality of pads arranged in a matrix form.

A wiring board according to the present invention includes a plurality of resin layers including a first resin layer disposed as an uppermost resin layer and a second resin layer adjacent to the first resin layer, a plurality of pads arranged in a substantially matrix form on the first resin layer, a plurality of first via-conductors having upper ends electrically connected to lower surfaces of the plurality of pads, respectively and penetrating the first resin layer in a thickness direction, a plurality of first wiring conductors having upper surfaces electrically connected to lower ends of the first via-conductors, respectively and being disposed between the first resin layer and the second resin layer, a plurality of second via-conductors having upper ends electrically connected to lower surfaces of the first wiring conductors, respectively and penetrating the second resin layer in the thickness direction, and a plurality of second wiring conductors having upper surfaces electrically connected to lower ends of the second via-conductors, respectively. The wiring board of the present invention further includes a rectangular mount region surrounded by four sides which are circumscribed to pads located in an outer peripheral area among the plurality of pads arranged in the substantially matrix form, a corner pad close to a corner of the mount region, and a second corner via-conductor electrically connected to the corner pad via the first via-conductor and the first wiring conductor, in which a distance in a plane direction between the second corner via-conductor and a center of the mount region is smaller than a distance in the plane direction between the corner pad and the center of the mount region.

According to the present invention, since thermal stress applied to a connection between a second corner via-conductor and a second wiring conductor can be alleviated, peeling off of the second corner via-conductor and second wiring conductor is suppressed, and furthermore a wiring board excellent in electric reliability can be obtained.

BRIEF DESCRIPTION OF THE DRAWINGS

FIG. 2A is an enlarged view illustrating R1 portion of FIG. 1B and FIG. 2B is an enlarged cross-sectional view illustrating the R1 portion which is cut along a diagonal line 22 of FIG. 1B.

DESCRIPTION OF THE PREFERRED EMBODIMENTS

Hereinbelow, a mounting structure including a wiring board according to one embodiment of the present invention is described in detail with reference to the accompanying drawings.

Figure 1A:
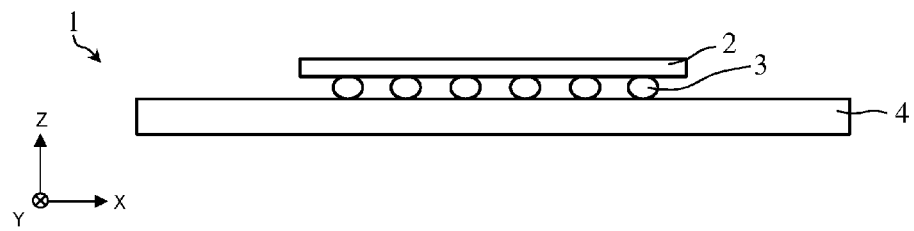
FIGS. 1A and 1B are a side view and a plan view illustrating a mounting structure including a wiring board according to one embodiment of the present invention, respectively.
Figure 1B:
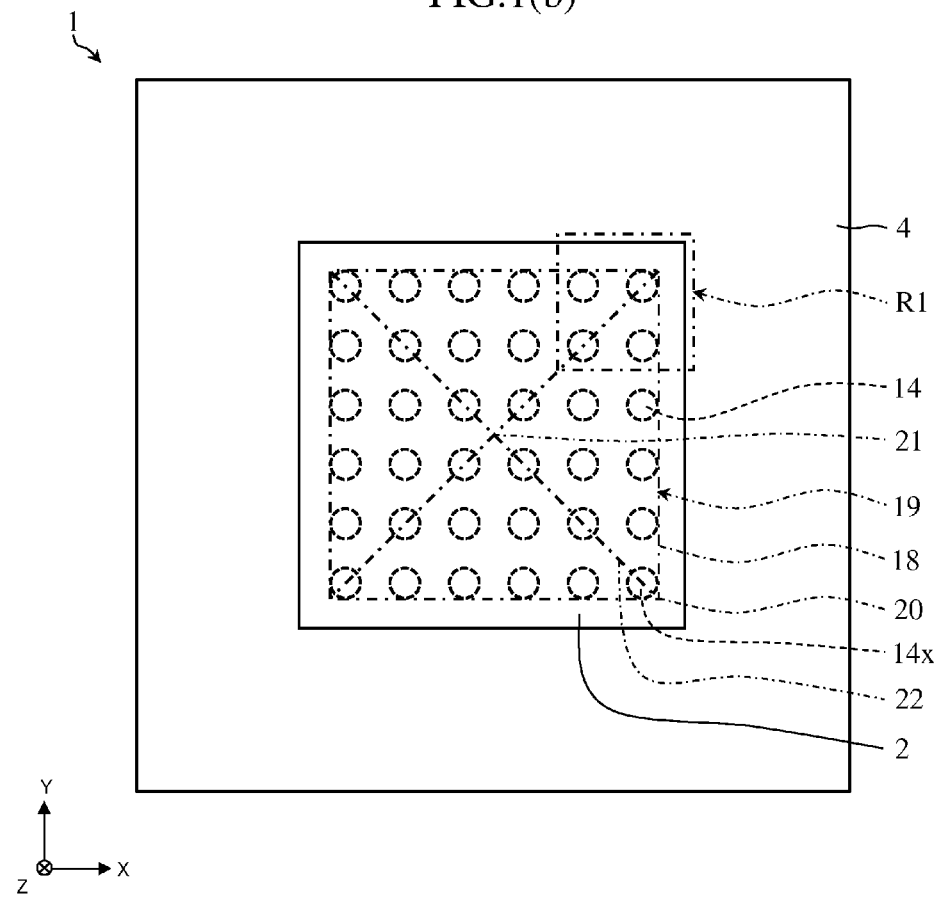

A mounting structure 1 illustrated in FIGS. 1A and 1B is used for various electronic devices, such as audio visual devices, electrical household appliances and electrical equipment, communication devices, computer devices, and peripherals thereof, for example. The mounting structure 1 includes a plate-like electronic part 2 and a plate-like wiring board 4 in which the electronic part 2 is mounted via bumps 3 in a flip chip manner.

<Electronic Part 2>

The electronic part 2 is a semiconductor element, such as an IC (Integrated Circuit), and LSI (Large Scale Integration), for example. The electronic part 2 includes a plate-like semiconductor substrate 5 and a plurality of disc-like electrodes 6 formed on a lower surface of the semiconductor substrate 5, as illustrated in FIGS. 2A and 2B. Coefficient of thermal expansion of the electronic part 2 is set to 2.5 ppm/° C. or higher and 3.5 ppm/° C. or lower, for example. Young's modulus of the electronic part 2 is set to 130 GPa or higher and 190 GPa or lower, for example. The coefficient of thermal expansion of each member is measured by TMA (Thermo Mechanical Analysis). The Young's modulus of each member is measured by DMA (Dynamic Mechanical Analysis).

The semiconductor substrate 5 functions as a semiconductor element in the electronic part 2. The semiconductor substrate 5 is formed of a semiconductor material, such as silicon, germanium, gallium arsenide, gallium arsenide phosphide, gallium nitride, and silicon carbide, for example.

The electrodes 6 function as terminals which electrically connects the electronic part 2 to the wiring board 4. Preferably, the electrodes 6 may be formed of conductive materials, such as copper, gold, aluminum, nickel, and chromium, and more preferably formed of copper among these from a viewpoint of conductivity.

The plurality of electrodes 6 are arranged in a substantially matrix form. As for the plurality of electrodes 6 arranged in the substantially matrix form, the plurality of electrodes 6 may be arranged in a vertical direction and a horizontal direction, there may be an area in which the electrodes 6 are partially not provided, or there may be an area in which the electrodes 6 are partially arranged in a zigzag form. The plurality of electrodes 6 are arranged with a pitch which is set to 50 μm or more and 250 μm or less. The pitch is obtained by measuring the length of a straight line which connects centers of the electrodes 6 adjacent to each other. Hereinafter, for each member described below, the pitch between the members is measured in the same way as the pitch between the electrodes 6.

<Bump 3>

The bump 3 is formed of conductor materials such as solder containing lead, tin, silver, gold, copper, zinc, bismuth, indium, aluminum, etc.

<Wiring Board 4>

The wiring board 4 electrically connects the electronic part 2 to a mother board (not illustrated). The electronic part 2 is mounted on an upper surface of the wiring board 4. The mother board is mounted on a lower surface of the wiring board 4 via ball bumps (not illustrated). The mother board has electrodes (not illustrated) electrically connected to the wiring board 4 on its upper surface. The pitch between the electrodes is larger than the pitch between the electrodes 6 of the electronic part 2.

The wiring board 4 includes a plate-like core substrate 7, and a pair of build-up layers 8 and 8 formed on upper and lower surfaces of the core substrate 7.

The core substrate 7 reinforces the wiring board 4 and electrically connects the pair of build-up layers 8 and 8 to each other. The core substrate 7 includes a plate-like base 9 in which multiple cylindrical through-holes penetrating in a thickness direction (Z direction) are formed, and a plurality of through-hole conductors 10 with which each of the through-holes is filled.

The base 9 has Young's modulus higher than that of a resin layer 11 described below, and increases rigidity of the core substrate 7. The base 9 contains resin such as epoxy resin, for example, silica filler coated with resin, and glass cloth coated with resin. A thickness of the base 9 is set to 0.4 mm or thicker and 1.2 mm or thinner, for example. The thickness of the base 9 is larger than a thickness of the resin layer 11 described below, and also larger than a thickness of one build-up layer 8. Coefficient of thermal expansion in a plane direction (direction of an XY plane) of the base 9 is set to 3 ppm/° C. or higher and 15 ppm/° C. or lower, for example. Young's modulus of the base 9 is set to 25 GPa or higher and 35 GPa or lower, for example.

The through-hole conductor 10 penetrates the base 9 in a thickness direction, electrically connecting the build-up layers 8 and 8 on the upper and lower surfaces of the core substrate 7 to each other. The through-hole conductor 10 is formed of conductive materials, such as copper, aluminum, and nickel, and preferably be formed of copper with high conductivity among these. The plurality of through-hole conductors 10 are arranged in a substantially matrix form. In the present embodiment, a pitch between the plurality of through-hole conductors 10 is smaller than the pitch between the plurality of electrodes 6. The pitch between the plurality of through-hole conductors 10 is set to 100 μm or more and 180 μm or less, for example.

As described above, the pair of build-up layers 8 and 8 are formed on upper and lower surfaces of the core substrate 7. The build-up layers 8 increase wiring density and function as multilayer interconnection layers for routing wiring. The build-up layer 8 includes a plurality of resin layers 11 which are laminated on the base 9 and in which a plurality of via-holes penetrating in a thickness direction are formed, a plurality of conductive layers 12 disposed between the base 9 and the resin layer 11 or between the resin layers 11 adjacent to each other, a plurality of via-conductors 13 with which each via-hole is filled and which electrically connect the conductive layers 12 to each other, and pads 14 which are arranged on an uppermost resin layer 11 and are electrically connected to the via-conductors 13. The bumps 3 are connected to the pads 14. According to the present embodiment, one build-up layer 8 includes three resin layers 11.

For convenience of description, the build-up layer 8 disposed near the electronic part 2 (i.e. on an upper side) is referred to as a first build-up layer 8a, and the buildup layer 8 disposed near the mother board (i.e. on a lower side) is referred to as a second build-up layer 8b.

The resin layer 11 not only functions as a support member which supports the conductive layer 12, but functions as an insulating member which prevents the conductive layers 12 from being short-circuited. The resin layer 11 contains resin, such as epoxy resin and polyimide resin, and silica filler coated with the resin. A thickness of the resin layer 11 is set to be smaller than the thickness of the base 9 having higher Young's modulus than the resin layer 11. As a result, the wiring formed in the build-up layers 8 is increased in density, and the rigidity of the wiring board 4 is increased due to the existence of the core substrate 7. The thickness of the resin layer 11 is set 10 μm or thicker and 40 μm or thinner, for example. Coefficient of thermal expansion of the resin layer 11 is set to 10 ppm/° C. or higher and 50 ppm/° C. or lower, for example. Young's modulus of the resin layer 11 is set to 1 GPa or higher and 15 GPa or lower, for example.

For convenience of description, the resin layer 11 included in the first build-up layer 8a is formed of three layers, a first resin layer 11a (top layer), a second resin layer 11b, and a third resin layer 11c which are disposed in order from top to bottom. The resin layer 11 included in the second build-up layer 8b includes a first resin layer 11d, and a second resin layer 11e which are disposed in order from top to bottom.

The conductive layer 12 functions as wiring for signals, wiring for grounding, or wiring for power supply. The conductive layer 12 may be formed of metallic materials, such as copper, silver, gold, aluminum, nickel, and chromium, and preferably formed of copper among these from a viewpoint of conductivity. A thickness of the conductive layer 12 is set to 5 μm or thicker and 25 μm or thinner. Coefficient of thermal expansion of the conductive layer 12 is set to 15 ppm/° C. or higher and 18 ppm/° C. or lower, for example. Young's modulus of the conductive layer 12 is set to 60 GPa or higher and 130 GPa or lower, for example.

The plurality of conductive layers 12 are separated from each other in the thickness direction. One conductive layer 12 is constituted by a plurality of wiring conductors 15 which are separated from each other in a plane direction and are disposed between the base 9 and the resin layer 11c or between the resin layers 11 adjacent to each other.

The wiring conductor 15 includes a pair of lands 16 and 16 which are formed in a disk shape and each of which has an upper surface and a lower surface to which the via-conductors 13 are electrically connected. The wiring conductor 15 further includes a linear wiring portion 17 which electrically connects the pair of lands 16 and 16 to each other and whose longitudinal direction is in parallel with the plane direction. The wiring conductor 15 may be formed to have only one land 16 having the upper and lower surfaces to which the via-conductor 13 is electrically connected, or may be formed in a solid shape.

For convenience of description, the plurality of wiring conductors 15 arranged between the first resin layer 11a and the second resin layer 11b are referred to as a plurality of first wiring conductors 15a. The wiring conductors 15 arranged between the second resin layer 11b and the third resin layer 11c are referred to as a plurality of second wiring conductors 15b. The plurality of wiring conductors 15 arranged between the third resin layer 11c and the base 9 are referred to as a plurality of third wiring conductors 15c.

The via-conductors 13 electrically connect the conductive layers 12, which are separated from each other in the thickness direction, to each other. The via-conductors 13 may be formed of metallic materials, such as copper, silver, gold, aluminum, nickel, and chromium, and preferably formed of copper among these from a viewpoint of conductivity. An upper end and a lower end of the via-conductor 13 have a circle shape, and the via-conductor 13 tapers to the core substrate 7. That is, the diameter of the via-conductor 13 decreases toward the core substrate 7. Coefficient of thermal expansion of the via-conductor 13 is set to 15 ppm/° C. or higher and 18 ppm/° C. or lower, for example. Young's modulus of the via-conductor 13 is set to 60 GPa or higher and 130 GPa or lower, for example.

For convenience of description, the plurality of via-conductors 13 which penetrate the first resin layer 11a in the thickness direction is referred to as a plurality of first via-conductors 13a. The plurality of via-conductors 13 which penetrate the second resin layer 11b in the thickness direction is referred to as a plurality of second via-conductors 13b. The plurality of via-conductors 13 which penetrate the third resin layer 11c in the thickness direction is referred to as a plurality of third via-conductors 13c.

Upper ends of the plurality of first via-conductors 13a are electrically connected to lower surfaces of the plurality of pads 14, respectively. Lower ends of the plurality of first via-conductors 13a are electrically connected to upper surfaces of the plurality of first wiring conductors 15a, respectively. Upper ends of the plurality of second via-conductors 13b are electrically connected to lower surfaces of the plurality of first wiring conductors 15a, respectively. Lower ends of the plurality of second via-conductors 13b are electrically connected to upper surfaces of the plurality of second wiring conductors 15b, respectively. Upper ends of the plurality of third via-conductors 13c are electrically connected to lower surfaces of the plurality of second wiring conductors 15b, respectively. Lower ends of the plurality of third via-conductors 13c are electrically connected to upper surfaces of the plurality of third wiring conductors 15c, respectively.

The pads 14 function as terminals for electrically connecting the wiring board 4 to the electronic part 2. The pads 14 may be formed of metallic materials, such as copper, silver, gold, aluminum, nickel, and chromium, and preferably formed of copper among these from a viewpoint of conductivity. The pads 14 have a disk shape, for example. A thickness of the pad 14 is set to 10 μm or thicker and 25 μm or thinner.

The plurality of pads 14 are arranged on positions corresponding to the plurality of electrodes 6. The plurality of pads 14 are arranged in a substantially matrix form like the plurality of electrodes 6. A pitch between the plurality of pads 14 is set to the same pitch between the plurality of electrodes 6, and is larger than the pitch between the through-hole conductors 10.

For convenience of description, a rectangular region surrounded by four sides 18 which are circumscribed to the pads located in an outer peripheral area among the plurality of pads 14 arranged in a substantially matrix form is referred to as a mount region 19. The pads 14 which are closest to corners 20 of the mount region 19 are referred to as corner pads 14x. The first via-conductors 13a electrically connected to the corner pads 14x are referred to as first corner via-conductors 13ax. The first wiring conductors 15a electrically connected to the first corner via-conductors 13ax are referred to as first corner wiring conductors 15ax. The second via-conductors 13b electrically connected to the first corner wiring conductors 15ax are referred to as second corner via-conductors 13bx. The second wiring conductors 15b electrically connected to the second corner via-conductors 13bx are referred to as second corner wiring conductors 15bx. The third via-conductors 13c electrically connected to the second corner wiring conductors 15bx are referred to as third corner via-conductors 13cx. The third wiring conductors 15c electrically connected to the third corner via-conductors 13cx are referred to as third corner wiring conductors 15cx.

In the second build-up layer 8b, the via-conductors 13 which are electrically connected to the corner pads 14x and penetrate a fourth resin layer 11d in the thickness direction are referred to as fourth via-conductors 13dx. The via-conductors 13 which are electrically connected to the corner pads 14x and penetrate a fifth resin layer 11e in the thickness direction are referred to as fifth via-conductors 13ex.

In the above mounting structure 1, the electronic part 2 is electrically connected to the plurality of pads 14 provided on the upper surface of the wiring board 4 via the bumps 3.

When the electronic part 2 is connected to the pads 14 of the wiring board 4, if heat is applied to the wiring board 4 and the electronic part 2, thermal stress attributable to difference in the coefficient of thermal expansion between the wiring board 4 and the electronic part 2 is likely to be applied to the pads 14 of the wiring board 4, and the thermal stress is also likely to be applied to the via-conductors 13 and the wiring conductors 15 via the pads 14. The thermal stress easily concentrates on the corner pad 14x which is closest to the corner 20 of the mount region 19 and which is distanced from a center 21 of the mount region 19, and furthermore easily concentrates on a connection between the second corner via-conductor 13bx and the second corner wiring conductor 15bx. The thermal stress easily concentrates on the connection especially when the second corner via-conductor 13bx tapers to the core substrate 7 in such a manner that a diameter of the second corner via-conductor 13bx decreases toward the core substrate 7.

In the present embodiment, as illustrated in FIGS. 2A and 2B, a distance in the plane direction between the second corner via-conductor 13bx and the center 21 of the mount region 19 is smaller than a distance in the plane direction between the corner pad 14x and the center 21 of the mount region 19. That is, the second corner via-conductor 13bx is close to the center 21 of the mount region 19. As a result, the thermal stress applied to the connection between the second corner via-conductor 13bx and the second corner wiring conductor 15bx can be alleviated. Therefore, peeling-off of the second corner via-conductor 13bx and the second corner wiring conductor 15bx can be suppressed. Therefore, disconnection in the wiring board 4 can be suppressed and the wiring board 4 excellent in electric reliability can be obtained. The center 21 of the mount region 19 is located at an intersection at which a pair of diagonal lines 22 of the mount region 19 cross each other in FIG. 1B.

In the present embodiment, the second corner via-conductor 13bx is located within the mount region 19 in a plan view. That is, the second corner via-conductor 13bx is close to the center 21 of the mount region 19. As a result, the thermal stress applied to the connection between the second corner via-conductor 13bx and the second corner wiring conductor 15bx can be alleviated.

In the present embodiment, the second corner via-conductor 13bx is located, in a plan view, on a line which connects a center of the corner pad 14x and the center 21 of the mount region 19. That is, the second corner via-conductor 13bx is close to the center 21 of the mount region 19. As a result, the thermal stress applied to the connection between the second corner via-conductor 13bx and the second corner wiring conductor 15bx can be alleviated. In FIGS. 1B and 2A, the line which connects the center of the corner pad 14x and the center 21 of the mount region 19 is positioned to overlap the diagonal line 22.

In the present embodiment, a distance in the plane direction between the third corner via-conductor 13cx and the center 21 of the mount region 19 is smaller than a distance in the plane direction between the second corner via-conductor 13bx and the center 21 of the mount region 19. That is, the third corner via-conductor 13cx is close to the center 21 of the mount region 19. As a result, the thermal stress applied to the connection between the third corner via-conductor 13cx and the third corner wiring conductor 15cx can be alleviated. Therefore, since peeling off of the third corner via-conductor 13cx and the third corner wiring conductor 15cx can be suppressed, disconnection in the wiring board 4 can be also suppressed.

According to the present embodiment, in the first build-up layer 8a, a distance in the plane direction between the via-conductor 13bx or 13cx and the center 21 of the mount region 19 is smaller than a distance in the plane direction between the via-conductor 13ax and the center 21 of the mount region 19. That is, as for the via-conductors 13 electrically connected to the corner pads 14x, the via conductors 13 are closer to the center 21 of the mount region 19 in this order from the via-conductors 13ax which are adjacent to the upper surface of the wiring board 4 to the via-conductors 13cx which are adjacent to the core substrate 7. As a result, the thermal stress applied to the connections between each of the via-conductors 13 and each of the wiring conductors 15 can be alleviated, and the peeling off of each via-conductor 13 and each wiring conductor 15 can be suppressed.

Since the second build-up layer 8b is connected to the first build-up layer 8a via the core substrate 7 having high rigidity, thermal stress from the corner pad 14x is difficult to reach the via-conductor 13 and the wiring conductor 15 in the second build-up layer 8b.

In the second build-up layer 8b, a distance in the plane direction between the via-conductor 13ex and the center 21 of the mount region 19 is larger than a distance in the plane direction between the via-conductor 13dx and the center 21 of the mount region 19. A distance in the plane direction between the center 21 of the mount region 19 and the via-conductor 13 which is electrically connected to the corner pad 14x, which is adjacent to the lower surface of the wiring board 4, and which may be referred to as a via-conductor 13fx hereinafter (although the via-conductor 13fx is not illustrated), is larger than a distance in the plane direction between the via-conductor 13ex and the center 21 of the mount region 19. That is, in the second build-up layer 8b to which the thermal stress from the corner pad 14x is difficult to be transferred, the via-conductors are farther from the center 21 of the mount region 19 in this order from the via-conductors 13dx which are adjacent to the core substrate 7 to the via-conductors 13fx which are adjacent to the lower surface of the wiring board 4. As a result, the wiring board 4 can be electrically connected to the mother board having an electrode pitch larger than the pitch between the electrodes 6 of the electronic part 2, maintaining the electric reliability of the wiring board 4.

In the present embodiment, the first corner wiring conductor 15ax includes a pair of lands 16 and 16 and a wiring portion 17. As a result, the first corner via-conductor 13ax and the second corner via-conductor 13bx which differ in the position in a plan view can be electrically connected by the first corner wiring conductor 15ax.

In the present embodiment, the pitch between the plurality of through-hole conductors 10 is smaller than the pitch between the plurality of pads 14. As a result, wiring can be routed to extend toward the center 21 of the mount region 19 from the corner pad 14x. Therefore, the distance in the plane direction between the second corner via-conductor 13bx and the center 21 of the mount region 19 can be made smaller than the distance in the plane direction between the corner pad 14x and the center 21 of the mount region 19.

The above mounting structure 1 performs a desired function by driving or controlling the electronic part 2 based on power supply or a signal which is supplied via the wiring board 4.

Next, a method for manufacturing the mounting structure 1 is described.

(1) Produce a core substrate 7. Specifically, the core substrate 7 is produced in the following manner, for example.

A copper-clad laminate is prepared. The copper-clad laminate is formed of a base 9, which is obtained by curing an uncured resin sheet, and sheets of copper foil applied to upper and lower surfaces of the base 9. Next, through-holes are formed in the copper-clad laminate through sand blast processing, laser processing, or drilling processing. Next, the inside of each through-hole is filled with a conductive material, for example, through electroless plating, an electrolytic plating method, a vapor deposition method, a chemical vapor deposition (CVD) method, a sputtering method, so that through-hole conductors 10 are formed.

In this way, the core substrate 7 is produced.

(2) Produce a wiring board 4 by forming a pair of build-up layers 8 on upper and lower surfaces of the substrate 7. Specifically, the wiring board 4 is produced in the following manner, for example.

First, the copper foil on the base 9 is patterned by photolithography, etching, or the like, so that a conductive layer 12 is formed. A resin layer 11 is formed on the conductive layer 12 by arranging an uncured resin on the conductive layer 12, heating the resin in order to cause the resin to flow and come into tight contact with the underlying layers, and further heating the resin to cure the resin. In this case, the resin layer 11 may be formed on the conductive layer 12 in such a manner that a resin film is arranged on the conductive layer 12 with an uncured resin interposed between the resin film and the conductive layer 12 and the resin is heated so as to be cured.

Next, via-holes are formed in the resin layer 11 through laser processing, and at least a part of the conductive layer 12 is exposed in the via-holes. Thus, since the via-holes are formed using laser processing, damage to the conductive layer 12 exposed in the via-holes can be reduced as compared with using sand blast processing.

Next, via-conductors 13 are formed in the via-holes and the conductive layer 12 is formed on the upper surface of the resin layer 11 through a semiadditive process, a subtractive process, a fully-additive process, or the like, for example.

Build-up layers 8 can be formed by repeating the above steps. Pads 14 can be formed on an upper surface of an uppermost resin layer 11 in the same manner as the conductive layer 12.

The wiring board 4 can be produced in the above-described manner. By repeating the present step, each of the resin layer 11 and the conductive layer 12 can be formed in multiple layers in the build-up layers 8.

(3) Form bumps 3 on upper surfaces of the pads 14 and mount the electronic part 2 on the wiring board 4 via the bumps 3 in a flip chip manner.

The mounting structure 1 illustrated in FIGS. 1A and 1B can be produced in the above-described manner.

The present invention is not limited to the embodiments described above, but various changes, improvements, combinations, etc. are possible with respect to the embodiments, without departing from the gist of the present invention.

For example, although the wiring board 4 is a build-up board including the core substrate 7 and the pair of build-up layers 8a and 8b in the above embodiment, the wiring board may be a coreless board which is formed of only the build-up layers.

Although the build-up layer 8 is a resin insulating layer including three resin layers 11 in the above embodiment, the build-up layer may be a resin insulating layer including at least two resin layers, or may be a resin insulating layer including four or more resin layers.

Although the through-hole is filled with the through-hole conductor 10 in the above embodiment, the through-hole conductor may be provided in the through-hole, or an inside wall of the through-hole may be coated with the via-conductor in a cylinder form.

Although the via-hole is filled with the via-conductor 13 in the above embodiment, the via-conductor may be provided in the via-hole or an inside wall of the via-hole may be coated with the via-conductor in a cylinder form.

Although the specific structure and arrangement of each via-conductor 13 and each wiring conductor 15 are described in the above embodiment, the present invention is not limited to this. As for the wiring board of the present invention, the distance in the plane direction between the second corner via-conductor and the center of the mount region may be smaller than the distance in the plane direction between the corner pad and the center of the mount region, and the structure and arrangement of each of the other via-conductors and each of the other wiring conductors can be suitably chosen.

Although the copper-clad laminate in which the copper foil is provided is used in Step (1) according to the above embodiment, metallic foil formed of metallic materials, such as an iron nickel alloy or an iron nickel cobalt alloy may be used instead of the copper foil.

What is claimed is:

1. A wiring board comprising:
a plurality of resin layers including a first resin layer disposed as an uppermost layer and a second resin layer adjacent to the first resin layer;
a plurality of pads arranged in a substantially matrix form on the first resin layer;
a plurality of first via-conductors having upper ends electrically connected to lower surfaces of the plurality of pads, respectively and penetrating the first resin layer in a thickness direction;
a plurality of first wiring conductors having upper surfaces electrically connected to lower ends of the plurality of first via-conductors, respectively and being disposed between the first resin layer and the second resin layer;
a plurality of second via-conductors having upper ends electrically connected to lower surfaces of the first wiring conductors, respectively and penetrating the second resin layer in a thickness direction;
a plurality of second wiring conductors having upper surfaces electrically connected to lower ends of the plurality of second via-conductors, respectively;
wherein the wiring board includes:
a rectangular mount region surrounded by four sides which are circumscribed to pads located in an outer peripheral area among the plurality of pads arranged in the substantially matrix form;
a corner pad close to a corner of the mount region; and
a second corner via-conductor electrically connected to the corner pad via the first via-conductor and the first wiring conductor,
wherein a distance in a plane direction between the second corner via-conductor and a center of the mount region is smaller than a distance in the plane direction between the corner pad and the center of the mount region.

2. The wiring board according to claim 1,
wherein the second corner via-conductor is located within the mount region in a plan view.

3. The wiring board according to claim 1, further comprising:
a plurality of third via-conductors having upper ends electrically connected to lower surfaces of the plurality of second wiring conductors, respectively,
wherein the plurality of resin layers further includes a third resin layer adjacent to the second resin layer,
the plurality of second wiring conductors are disposed between the second resin layer and the third resin layer,
the plurality of third via-conductors penetrate the third resin layer in the thickness direction,
a third corner via-conductor electrically connected to the second corner via-conductor via the second wiring conductor is further included, and
a distance in the plane direction between the third corner via-conductor and the center of the mount region is smaller than a distance in the plane direction between the second corner via-conductor and the center of the mount region.

4. The wiring board according to claim 1,
wherein the second corner via-conductor is located on a line which connects a center of the corner pad and the center of the mount region.

5. The wiring board according to claim 1,
wherein the first wiring conductor includes a first corner wiring conductor electrically connected to the second corner via-conductor and
the first corner wiring conductor includes a linear wiring portion whose longitudinal direction is in parallel with the plane direction.

6. The wiring board according to claim 1,
wherein the plurality of resin layers includes a core substrate disposed on an upper surface thereof, and
the core substrate includes a base and a plurality of through-hole conductors penetrating the base in the thickness direction and being electrically connected to the plurality of second wiring conductors, respectively,
a pitch between the plurality of through-hole conductors is smaller than a pitch between the plurality of pads.

7. A mounting structure comprising:
the wiring board according to claim 1; and an electronic part mounted on an upper surface of the wiring board and electrically connected to the plurality of pads.

* * * * *